United States Patent [19]

Kawamura

[11] Patent Number: 4,481,483

[45] Date of Patent: Nov. 6, 1984

[54] LOW DISTORTION AMPLIFIER CIRCUIT

[75] Inventor: Shigeru Kawamura, Tokyo, Japan

[73] Assignee: Clarion Co., Ltd., Tokyo, Japan

[21] Appl. No.: 458,094

[22] Filed: Jan. 14, 1983

[30] Foreign Application Priority Data

Jan. 21, 1982 [JP] Japan .................................... 57-8048
Mar. 16, 1982 [JP] Japan .................................... 57-42137

[51] Int. Cl.$^3$ ............................................. H03F 3/04
[52] U.S. Cl. ................................... 330/297; 330/149; 330/288
[58] Field of Search ................. 330/149, 288, 296, 297

[56] References Cited

U.S. PATENT DOCUMENTS 3,450,998  6/1969  Greefkes et al. ..................... 330/296
4,369,411  1/1983  Niimura et al. .................. 330/288 X

*Primary Examiner*—James B. Mullins
*Assistant Examiner*—Steven J. Mottola

*Attorney, Agent, or Firm*—Flynn, Thiel, Boutell & Tanis

[57] ABSTRACT

A low-distortion amplifier circuit which comprises a transistor amplification circuit composed of an amplification transistor and an input terminal, an output terminal and a power source terminal, a first resistor connected between the input terminal and the amplification transistor, a second resistor connected between the output terminal and the power source terminal, and n pieces of forward direction diode elements which are made of transistors with the same characteristic as that of the amplification circuit, have their collectors and bases being shorted, and are connected in series together with the second resistor between the output terminal and the power source terminal. The first and second resistors are arranged to have resistors so that the proportion between these two resistors multiplied by the amplification rate of each transistor equals the number n of forward direction diode elements.

4 Claims, 3 Drawing Figures

LOW DISTORTION AMPLIFIER CIRCUIT

BACKGROUND OF THE INVENTION

This invention relates to a low-distortion amplifier circuit without the use of negative feedback.

In the prior art, negative feedback has been viewed as a requisite for construction of a low-distortion amplifier circuit using a transistor in order to cancel a nonlinearity peculiar to the transistor.

However, in a high-fidelity amplifier which is today demanded by audio fans, low distortion due to negative feedback, instead causes instability in the high frequency range and deteriorates high fidelity. This has been an unfavorable problem from the view point of sound effect.

OBJECT OF THE INVENTION

It is therefore an object of the present invention to realize low distortion in an amplifier circuit without the use of negative feedback system.

A further object of the present invention is to realize low distortion in an amplifier circuit with the use of a current mirror circuit but without the use of negative feedback.

SUMMARY OF THE INVENTION

To attain the objects, the low-distortion amplifier circuit according to the present invention comprises a first resistor connected to an input terminal of a transistor amplifier circuit, and a second transistor as well as n forward direction diode elements connected in series between an output terminal of the transistor amplifier circuit and a power source terminal.

Said transistor amplifier circuit comprises at least one transistor or a transistor current mirror circuit, said forward direction diode elements comprise transistors having the same characteristic as the transistor of said transistor amplifier circuit with collectors and bases thereof having shorted, and the ratio of the first resistor to the second resistor or the product of the ratio and electric current amplification rate of said transistor equals n.

DETAILED DESCRIPTION

Figure 1:
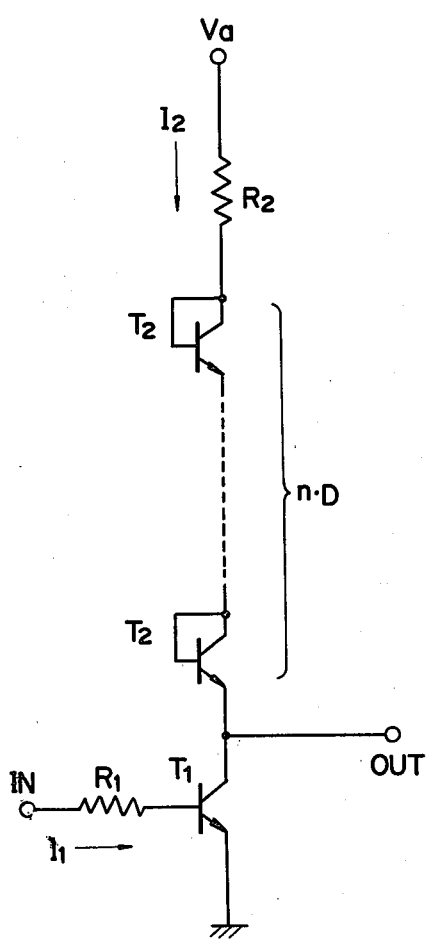
FIGS. 1, 2 and 3 are circuit diagrams, each showing a respective embodiment according to the present invention.

The present invention will now be described in detail by way of preferred embodiments shown in the drawings.

FIG. 1 shows a first embodiment of the low distortion amplifier circuit according to this invention. In the Figure, the reference numeral $T_1$ refers to a transistor which is part of a transistor amplifier circuit, IN to an input terminal of the transistor amplifier circuit, OUT to an output terminal of the transistor, $V_a$ to a power source terminal of the transistor amplifier circuit, $R_1$ to a first resistor, $R_2$ to a second resistor, and $T_2$ to a plurality (n pieces) of transistors having the same characteristic as the transistor $T_1$. Collectors and bases of the respective transistors $T_2$ are shorted so that each transistor $T_2$ makes up a diode element D equivalent to a diode forwardly directed to the output terminal OUT. The transistors $T_2$ are so connected that n pieces of the diode elements D are in series.

With this arrangement, since transistors $T_2$ with the same characteristic are connected in series, voltages at the respective bases and the associated emitters are the same, namely $V_{BE}$. Assuming that the current amplification rate of the transistor $T_1$ is $h_{FE}$, source voltage is $V_{cc}$, input signal is $V_i$, and output signal $V_o$, the current $I_1$ which flows through the first resistor $R_1$ is expressed by:

$$I_1 = (V_i - V_{BE})/R_1$$

and the current $I_2$ which flows through the second resistor $R_2$ is expressed by:

$$I_2 = I_1 \cdot h_{FE} = h_{FE} \cdot (V_i - V_{BE})/R_1.$$

Further, the output signal $V_o$ is expressed by:

$$\begin{aligned} V_o &= V_{cc} - R_2 \cdot I_2 - n \cdot V_{BE} \\ &= V_{cc} - R_2 \cdot h_{FE}(V_i - V_{BE})/R_1 - n \cdot V_{BE} \\ &= V_{cc} - R_2 \cdot h_{FE} V_i/R_1 + (R_2 \cdot h_{FE}/R_1 - n)V_{BE} \end{aligned} \quad (1)$$

When $R_2 \cdot h_{FE}/R_1 = n$, by substitution of this expression in the expression (1), $$V_o = V_{cc} - n \cdot V_i \quad (2)$$

is obtained.

As apparent from the expression (2), the input signal $V_i$ applied to the transistor $T_1$ from the input terminal IN is multiplied by n and is outputted from the output terminal OUT as being the output signal $V_o$.

Namely, under the condition of $R_2 \cdot h_{FE}/R_1 = n$, by using transistors with the same characteristic, it is possible to actuate the amplifier circuit freely from distortion without the use of negative feedback, even if the individual transistors themselves are non-linear elements.

Figure 2:
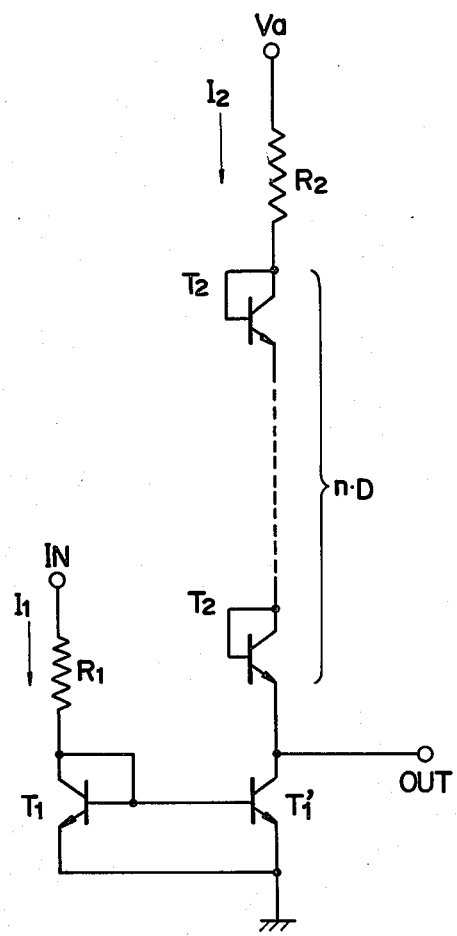

FIG. 2 shows a second embodiment according to the present invention in which a current mirror circuit is used instead of the transistor $T_1$ as the transistor amplifier circuit. The current mirror circuit comprises transistors $T_1$ and $T'_1$ and the second resistor $R_2$ is designed to have a resistance n times as large as the resistance of the first resistor $R_1$.

With this arrangement, since the current mirror circuit is composed of the transistors $T_1$ and $T'_1$, current $I_1$ from the input terminal IN and current $I_2$ from the power source terminal $V_a$ are equal. Further, voltages at points between the respective bases and the associated emitters are the same, namely, $V_{BE}$. Therefore, if the power source voltage is $V_{cc}$, the input signal voltage is $V_i$, the output signal voltage is $V_o$, and the resistance of the first resistor $R_1$ is R, the output signal voltage $V_o$ is expressed by:

$$V_o = V_{cc} - I_2 \times n \cdot R - nV_{BE} \quad (3).$$

In this case, since $I_1 = I_2 = (V_i - V_{BE})/R$, the output signal voltage $V_o$ is expressed by:

$$\begin{aligned} V_o &= V_{cc} - (V_i - V_{BE})nR/R - nV_{BE} \\ &= V_{cc} - nV_i. \end{aligned} \quad (4)$$

As apparent from the expression (4), the input signal voltage $V_i$ applied at the input terminal IN is multiplied n times and is output from the output terminal OUT as the output signal voltage $V_o$.

In this case, by using the transistors $T_1$, $T'_1$ and $T_2$ with the same characteristic, it is possible to actuate the amplifier circuit freely from distortion without the use of negative feedback, even if the individual transistors themselves are non linear elements.

A circuit according to this embodiment resulted in 0.04% of distortion (T.H.D.—total harmonic distortion), for example.

Figure 3:
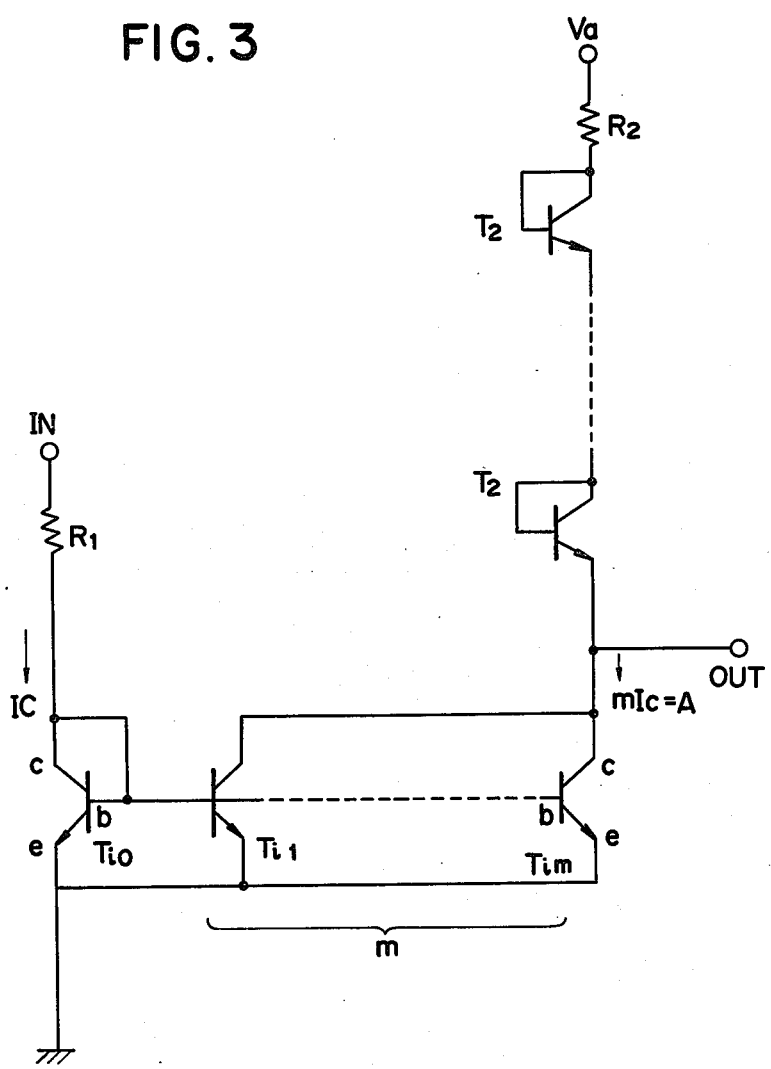

Use of the current mirror circuit enables incorporation of said transistor amplifier circuit into an integrated circuit, thereby keeping current amplification rate $h'_{FE}$ of the amplifier circuit constant without fluctuation. FIG. 3 shows an example of the amplifier circuit in which the current mirror circuit facilitating the realization of an IC is used as said transistor amplifier circuit. Namely, m+1 pieces of transistors $T_{i0}$ and $T_{i1}$ to $T_{im}$ are connected in parallel with bases b and emitters e thereof being respectively connected, with the base and the collector of one of the transistors being shorted to serve as a base b and with the collectors of the other m pieces of the transistors being used to serve a common collector c.

Collector current A in the transistor amplifier circuit united as in the above becomes m times the collector current $I_c$ of each transistor. When the current amplification rate $h_{FE}$ is large, each base current may be neglected, whereby the base current of the transistor amplifier circuit becomes substantially the same as the collector current of one transistor. Therefore, when the current amplification $h_{FE}$ of each transistor is larger than the number m of transistors, the current amplification rate $h'_{FE}$ of the united circuit becomes equal to m. This parallel connection of plural transistors permits selection of the current amplification rate of the united transistor by determining the number of the transistors and hence ensures constant amplification rate without fluctuation.

As described in the above, the present invention in which the amplifier circuit comprises plural transistors with the same characteristic ensures realization of a low distortion amplifier circuit without the use of negative feedback. This further enables construction of a high-fidelity amplifier free from any bad influence due to negative feedback.

It should be noted that, although NPN-type transistors are used in the embodiments described above, PNP type transistors bring the same effect.

The embodiments of the invention in which an exclusive property or privilege is claimed are defined as follows:

I claim:

1. A low distortion amplifier circuit, comprising: a transistor amplifier circuit having an input and an output; an input terminal; an output terminal connected to said output of said transistor amplifier circuit; a power source terminal; a first resistor and a plurality of diode elements all connected in series with each other between said output terminal and said power source terminal and oriented to facilitate a current flow from said power source terminal to said output terminal; and a second resistor connected between said input and said input terminal; wherein said transistor amplifier circuit includes at least one amplification transistor; wherein said forward-direction diode elements each include a transistor having the same characteristics as said amplification transistor and having its collector and base shorted; and wherein the current amplification rate of said amplification transistor multiplied by the ratio of the resistance of said first resistor to the resistance of said second resistor is a number substantially equal to the number of said diode elements.

2. The low distortion amplifier circuit of claim 1, wherein said transistor amplifier circuit includes a current mirror circuit having a plurality of transistors with the same characteristics.

3. A low distortion amplifier circuit, comprising: an input terminal; an output terminal; a power source terminal; means defining a first transistor having its collector connected to said output terminal; a plurality of second transistors which each have characteristics substantially identical to those of said first transistor and which each have a short between the collector and base thereof; a first resistor, said first resistor and said second transistors being connected in series with each other between said power source terminal and the collector of said first transistor, said second transistors being oriented so as to permit current to flow from said power source terminal to said output terminal; a third transistor which has characteristics substantially identical to those of said first transistor and which has its emitter connected to the emitter of said first transistor; and a second resistor connected at one end to said input terminal and at its other end to the collector and base of said third transistor and to the base of said first transistor; and wherein the current amplification factor of said first transistor multiplied by the ratio of the resistance of said first resistor to the resistance of said second resistor is a number approximately equal to the number of said second transistors.

4. The circuit of claim 3, wherein said first transistor is defined by a plurality of transistors which have substantially identical characteristics and which are connected in parallel with each other.

* * * * *